United States Patent [19]
Yakshin et al.

[11] 4,023,396
[45] May 17, 1977

[54] IMPACT IMPULSE MEASURING DEVICE

[76] Inventors: Alexandr Sergeevich Yakshin, ulitsa Malaya Filevskaya, 66, kv. 104; Oleg Nikolaevich Novikov, ulitsa Kuznetsky most, 18/7, kv. 6; Dmitry Alexeevich Grechinsky, ulitsa Tolbukhina, 8, korpus 2, kv. 48; Viktor Alexandrovich Klochko, ulitsa Oktyabrskaya, 38, kv. 374; Viktor Georgievich Rygalin, Dorozhny proezd, 5, korpus 2, kv. 103, all of Moscow, U.S.S.R.

[22] Filed: Dec. 15, 1975

[21] Appl. No.: 640,451

[30] Foreign Application Priority Data
Dec. 19, 1974  U.S.S.R. ............................ 2087455

[52] U.S. Cl. ..................................... 73/12; 73/71.2; 235/151.3
[51] Int. Cl.² ........................................ G01P 15/04
[58] Field of Search ............. 73/12, 71.2, 71.4, 492; 324/99 D, 103 P; 235/151.3, 15.31

[56] References Cited
UNITED STATES PATENTS
3,833,797  9/1974  Grobman et al. .............. 235/151.3
3,930,248  12/1975  Keller ............................ 235/151.3

*Primary Examiner*—James J. Gill
*Attorney, Agent, or Firm*—Lackenbach, Lilling & Siegel

[57] ABSTRACT

An impact impulse measuring device comprises, in accordance with the invention, an acceleration pick-up which transforms a mechanical shock into electric signals and is connected via an amplification unit to a unit for measuring the peak value of an impact impulse. The impact impulse measuring device also includes a noise rejector comprising a counting decade connected to the output of the unit for measuring the peak value of an impact impulse, a commutator coupled to outputs of the decade, an AND NOT gate, a flip-flop and an AND gate. The outputs of the commutator are connected via the AND NOT gate to an adjusting input of the flip-flop and its output is coupled with the AND gate. Eight levels of noise protection can be set with the help of commutator contacts. The proposed impact impulse measuring device increases the accuracy of measuring the peak value of the impact impulse by eliminating noise pulses from the measuring process, increases the quality of results obtained in shock tests and reduces the expenses of such tests.

5 Claims, 5 Drawing Figures

IMPACT IMPULSE MEASURING DEVICE

The present invention relates to devices for measuring the parameters of impact impulses and, in particular, to devices for measuring the peak value of an impact impulse provided with protection against mechanical noises produced, for example, when travelling members of shock test bench move on rails, as well as when a travelling platform collides with the base of the shock test bench after the main impact impulse.

There are known impact impulses measuring devices, wherein an acceleration pick-up transforms a mechanical shock into electrical signals and then feeds the signals through an amplification unit to a unit for measuring parameters of impact impulses. This device measures the peak value of impact impulses.

The known devices, however, are not provided with a noise protection unit and, therefore, measure the peak value of not only the useful signal but also of noises caused, for example, by travelling parts of the shock bench moving along rails, as well as by collisions of the travelling platform with the base of the shock bench following the main impact impulse. The accuracy and authenticity of measurements of the peak value of the useful impact impulse produced on collision of objects or by subjecting a test object to a mechanical shock on a shock bench are, therefore, drastically reduced.

It is an object of this invention to provide a device for measuring impact impulses provided with a noise rejecting unit for ensuring measurements of the peak value of impact impulse of high accuracy and eliminating any influence of noises on the results of measurements.

This is achieved by an impact impulse measuring device comprising an acceleration pick-up which transforms the mechanical shock into electrical signals, an amplification unit, its input being connected to the output of the acceleration pick-up and its output being connected to a unit for measuring the peak value of an impact impulse, and a noise rejector composed of a counting decade, its input being connected to one output of the unit of measuring the peak value of an impact impulse, a commutator, its inputs being connected to the outputs of the counting decade, an AND NOT gate, an AND gate and a flip-flop, the outputs of the commutator being connected to the inputs of the AND NOT gate, the output of the AND NOT gate being connected to the adjusting input of the flip-flop, one input of the AND gate being connected to the flip-flop output and its other input being connected to a transcription line and an output being connected to an adjusting input of memory registers, the memory registers + information inputs being connected to other outputs of the unit of measuring the peak value of an impact impulse and their outputs being connected to an indictor.

Such a design of a device ensures, according to the invention, that the measurement of the peak value of an impact impulse will be of a high accuracy. Besides, the proposed device eliminates noise caused by, for example, movement of travelling parts of a shock bench on rails or by collisions of the travelling platform and the base of the shock bench following the main impact impulse.

The invention will now be described in greater detail with reference to a specific embodiment thereof, taken in conjunction with the accompanying drawings, wherein:

FIG. 4 is a block diagram of a unit for measuring the peak value of an impact impulse, according to the invention

Figure 1:
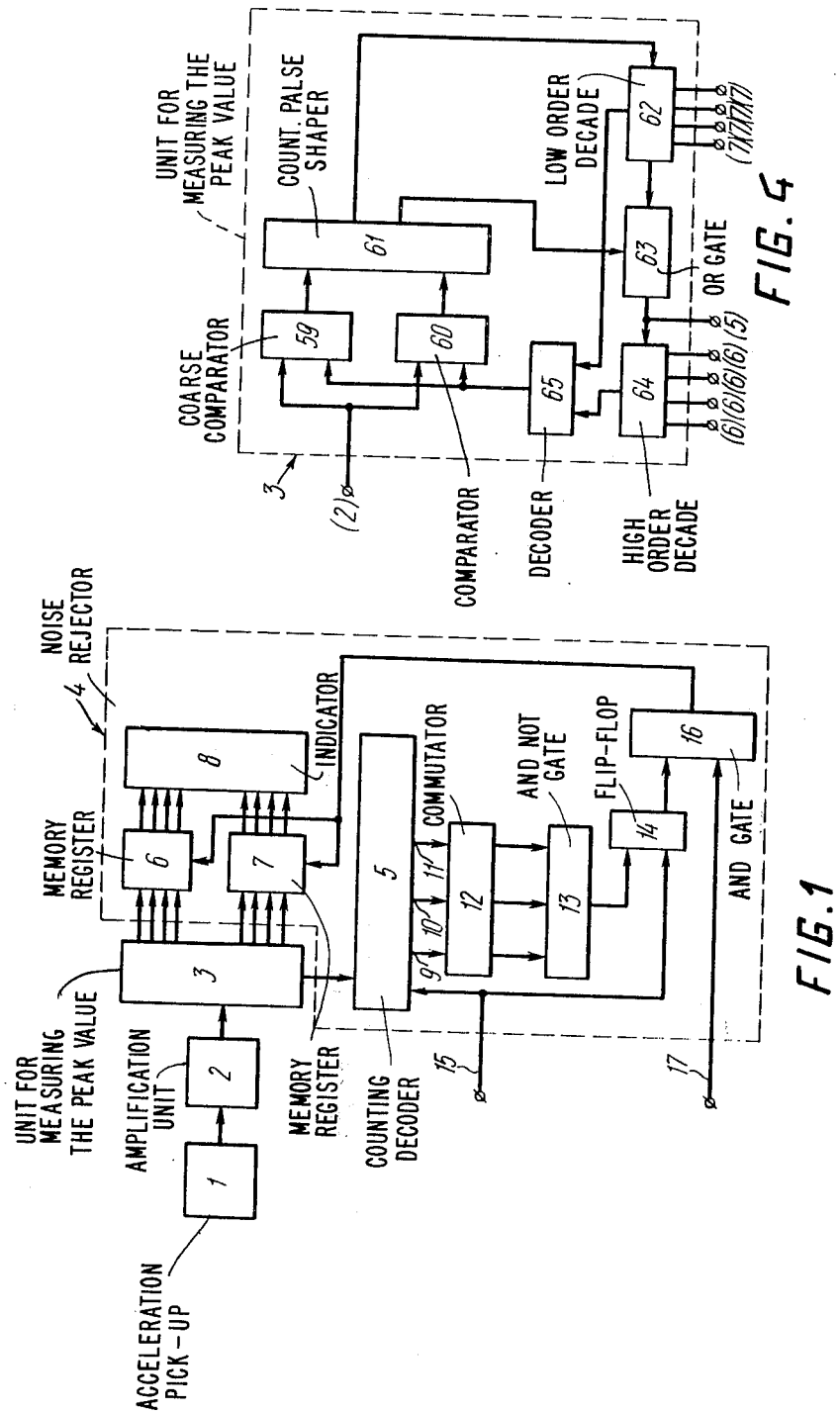
FIG. 1 is a block diagram of an impact impulse measuring device, according to the invention.

An impact impulse measuring device comprises a piezoelectric acceleration pick-up 1 (FIG. 1) transforms the mechanical shock into electrical signals (cf. for example, Pellinets V.S. Impact Acceleration Measurement, Standard Publishers, Moscow, 1975, pp. 184–190) and which is conncted via an amplification unit 2 (ibid. pp. 194–204) to a unit 3 for measuring the peak value of an impact impulse.

The unit 3 for measuring the peak value of an impact impulse is connected to a noise rejector 4.

The noise rejector 4 includes a counting decade 5 whose input is coupled to one output of the unit 3 for measuring the peak value of an impact impulse, the other outputs of the unit 3 for measuring the peak value of an impact pulse being connected to information inputs of memory registers 6 and 7. The outputs of the memory registers 6 and 7 are connected to an indicator 8.

A first output 9, a second output 10 and a third output 11 of the counting decade 5 are connected to the inputs of a commutator 12, the outputs of said commutator 12 being coupled to the inputs of an AND NOT gate 13. The output of the AND NOT gate 13 is connected to one of the inputs of a flip-flop 14, the other input of said flip-flop 14 being connected to a reset line 15 and to the counting decade 5. The output of the flip-flop 14 is connected to the first input of an AND gate 16, the second input of said AND gate 16 being connected to a transcription line 17. The output of the AND gate 16 is connected to adjustment inputs of the memory registers 6 and 7.

The counting decade 5 (FIG. 2) uses D-flip-flops 18, 19, 20, 21 and ANd gates 22 and 23. The C-input of the D-flip-flop 18 is connected to the output of the unit 3 for measuring the peak value of an impact impulse. The D-input of the D-flip-flop 18 is connected to its inverted output, the C-input of the flip-flop 19 and the C-input of the D-flip-flop 21. The R-input of the D-flip-flops 18, 19, 20 and 21 is connected to a reset line 15. The D-input of the D flip-flop 19 is connected to the output of the AND gate 22, and one of the inputs of said AND gage 22 is connected to the inverted output of the D-flip-flop 19 and the C-input of the D-flip-flop 20. The other input of the AND gate 22 is connected to the output of the D-flip-flop 21. The D-input of the D-flip-flop 20 is connected to its inverted output, the outputs of the D-flip-flops 19, 20 and 21 are connected to contacts 24, 25 and 26 respectively of the commutator 12. The outputs of the commutator 12 are connected to the inputs of the AND NOT gate 13, the output of said AND NOT gate 13 being coupled to the C-input of the flip-flop 14. The R-input of the flip-flop 14 is connected to the reset line 15. The output of the flip-flop 14 is connected to one of the inputs of the AND gate 16, the other input of said AND gate 16 being connected to the transcription line 17. The output of the AND gate 16 is connected to the adjustment inputs of the memory registers 6 and 7.

Figure 3:
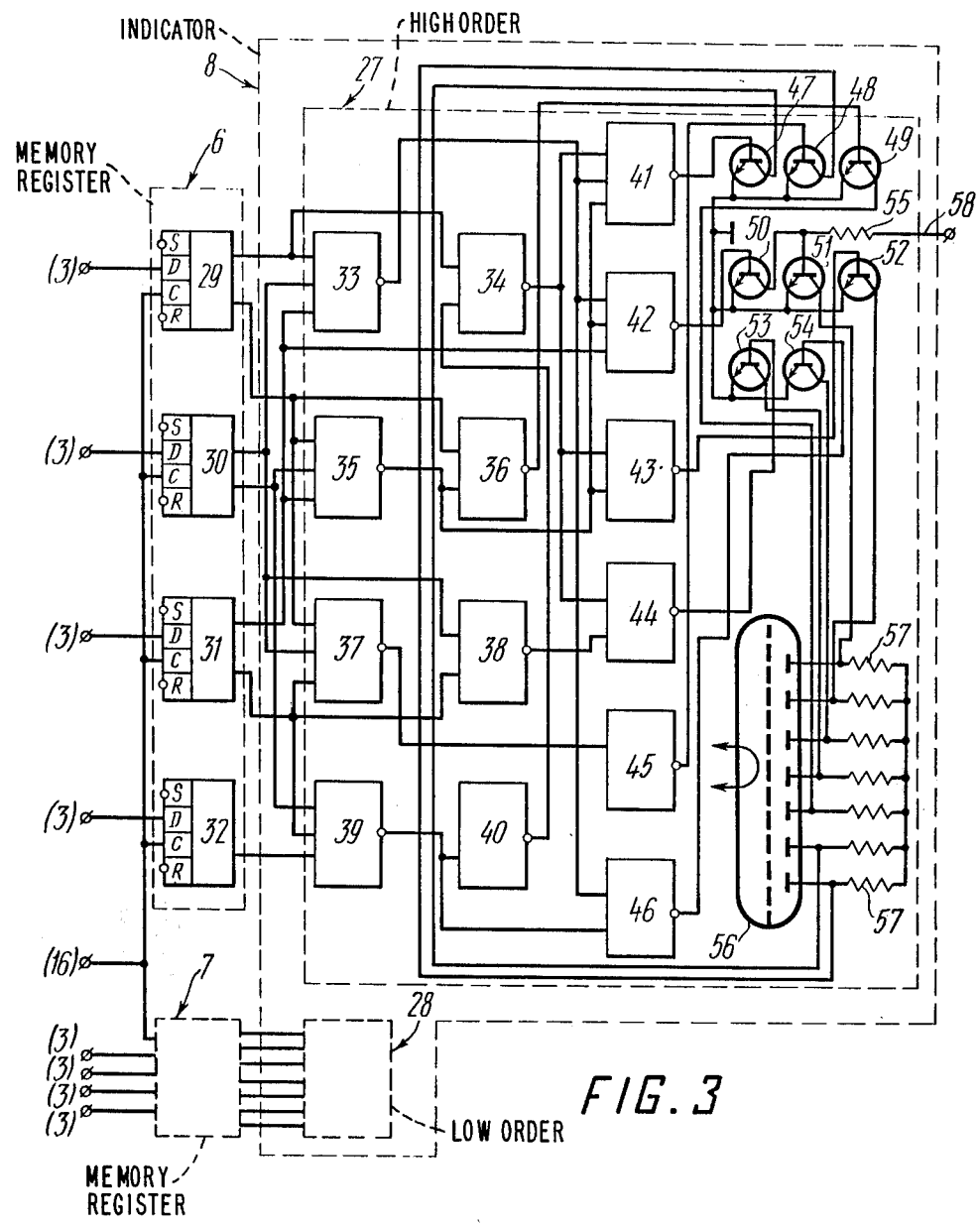
FIG. 3 is a functional diagram of memory registers and an indicator, according to the invention.

The memory registers 6 and 7 (FIG. 3) are made analogous and for simplicity only the key diagram of the memory register 6 is supplied. The memory register 6 is connected to a high order 27 of the indicator 8, the memory register 7 is connected to a low order 28 of the indicator 8.

The memory register 6 uses D-flip-flops 29, 30, 31 and 32. C-inputs of the D flip-flops 29, 30, 31 and 32 are connected to the output of the AND gate 16. The D-inputs of said D-flip-flops 29, 30, 31 and 32 are conected to the outputs of the unit 3 for measuring the peak value of an impact impulse.

The high order 27 of the indicator 8 comprises AND NOT gates 33, 34, 35, 36, 37, 38, 39, 40, 41, 42, 43, 44, 45, 46, transistors 47, 48, 49, 50, 51, 52, 53, 54, a resistor 55 and an indicator lamp 56 with load resistors 57. One output of the D-flip-fop 29 of the memory register 6 is connected to the first input of the logical AND NOT gates 33 and 34 of the high order 27, the other output of the D flip-flop 29 is connected to the first input of the AND NOT gates 35, 36, 37. One output of the D-flip-flop 30 is connected to the second input of the AND NOT gates 33 and 37, as well as to the first input of the AND NOT gate 38. The other output of the D-flip-flop 30 is connected to the second input of the AND NOT gate 35 and to the first input of the AND NOT gate 39. One output of the D-flip-flop 31 is connected to the third input of the AND NOT gates 33, 35, 42. Its other output is connected to the third input of the AND NOT gate 37 and to the second input of the AND NOT gates 38 and 39. The output of the D-flip-flop 32 is connected to the third input of the AND NOT gate 39. The output of the AND NOT gate 33 is connected to the second input of the AND NOT gate 41 and the first input of the AND NOT gates 42 and 46. The output of the AND NOT gate 35 is connected to the second input of the AND NOT gates 36, 41, 42 and 43. The output of the AND NOT gate 37 is connected to the input of the AND NOT gate 45. The output of the AND NOT gate 39 is connected to the second input of the AND NOT gate 46 and to the input of the AND NOT gate 40, the output of said AND NOT gate 40 being connected to the second input of the AND NOT gate 34. The output of the AND NOT gate 34 is connected to the first input of the AND NOT gates 41, 43 and 44. The output of the AND NOT gate 38 is connected to the second input of the AND NOT gate 44. The outputs of the AND NOT gates 41, 45, 36, 42, 43, 44, 46 are connected via the transistors 47, 48, 49, 51, 52, 53 and 54 respectively to the anodes of the indicator tube 56 with load resistors 57. The resistor 55 is connected to a feed bar 58.

The low order 28 of the indicator 8 is made analogous to the high order 27 and is not supplied for simplicity.

The unit 3 for measuring the peak value of an impact impulse is made as, for example, is illustrated in FIG. 4. The unit 3 for measuring the peak value of an impact impulse comprises coarse and fine comparators 59 and 60, whose inputs are connected to the output of the amplification unit 2, and a count pulse shaper 61 connected to the outputs of the comparators 59 and 60. One output of the count pulse shaper 61 is connected to the input of a low order decade 62 and the other of its inputs to an OR gate 63, the other input of said OR gate 63 being connected to the output of the low order decade 62. The output of the OR gate 63 is connected to the input of a high order decade 64. The input of the high order decade 64 is connected to the input of the counting decade 5.

Outputs of the high and low order decades 64 and 62 are connected to the inputs of a decoder 65, the output of said decoder 65 being connected to the second inputs of the coarse and fine comparators 59 and 60. Other outputs of the high and low order decades 64 and 62 of the unit 3 for measuring the peak value of an impact impulse are connected respectively to the inputs of the memory registers 6 and 7.

Other embodiments of the unit 3 for measuring the peak value of an impact impulse are also possible, provided a sequence of pulses or trains of pulses carrying information as to the peak value of a useful impact impulse and noise is generated at the input of the high order decade 64 of the unit 3 for measuring the peak value of an impact impulse.

Figure 5:
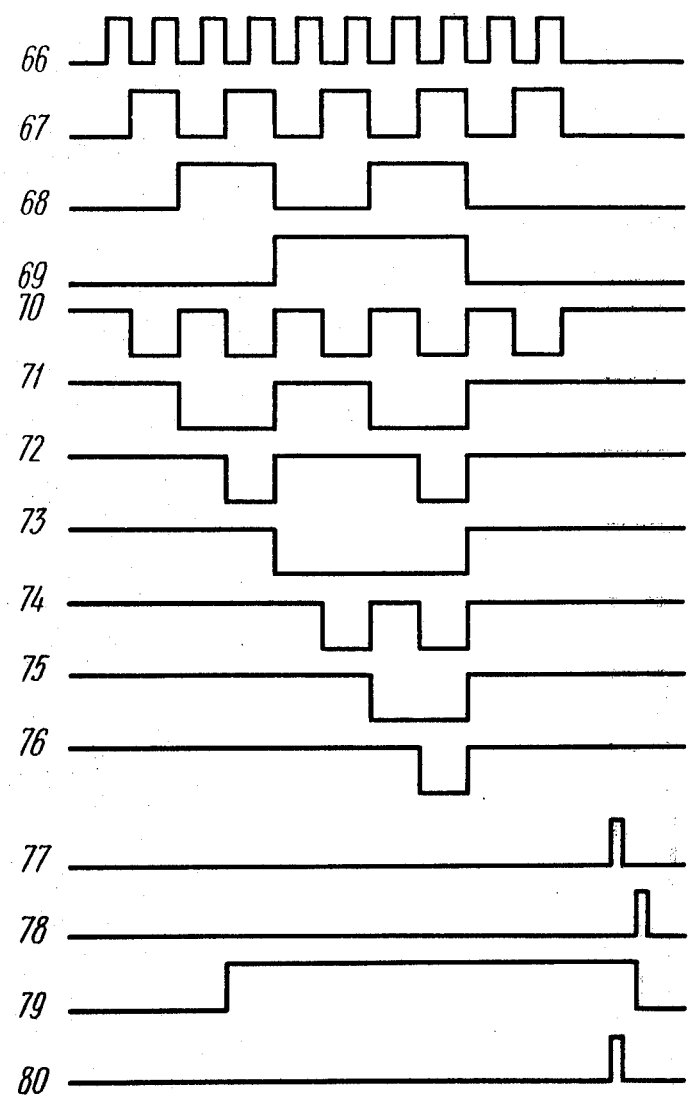
FIG. 5 shows pulse-time plots illustrating the operation of the noise rejector of FIG. 2, according to the invention.

The pulse time plots of FIG. 5 are supplied for a better understanding of the principle of operation of the device for measuring impact impulses.

FIG. 5 demonstrates: the sequence of pulses 66 at the input of the counting decade 5 (FIG. 1), pulses 67 at the first output 9 (FIG. 1) of the counting decade 5, pulses 68 at the second output 10 of the counting decade 5, pulses 69 at the third output of the counting decade 5, pulses 70, 71, 72, 73, 74, 75 and 76 at the output of the AND NOT gate 13 for seven levels of protection I, II, III, IV, V, VI and VII respectively, a transcription pulse 77, a reset pulse 78, a pulse 79 at the output of the flip-flop 14 for a specified protection level equal to three (III) and a pulse 80 at the output of the AND gate 16 supplied to the memory registers 6 and 7.

The impact impulse measuring device operates as follows:

An electrical signal is supplied from the output of the acceleration pick-up 1 (FIG. 1), which is positioned on a test object (not shown), to the amplification unit 2. At the output of the amplification unit 2 a signal is generated, its shape being a copy of the impact impulse. Electrical signals generated at the output of the amplification unit 2 include along with the useful signal, noises caused by rattling of the impact impulse platform and by collisions of the base and the shock bench platform following the impact impulse. These noise signals together with the useful signal are fed to the input of the unit 3 for measuring the peak value of an impact impulse.

The input signal fed to the coarse and fine comparators 59 and 60 (FIG. 4) of the unit 3 for measuring the peak value of an impact impulse is compared to the feedback signal produced at the output of the decoder 65. The signal produced as a result at the outputs of the coarse and fine comparators 59 and 60 is converted into a digital code in the count pulse shaper 61 and recorded in the low and high order decades 62 and 64. This signal contains information on the peak value of the impact impulse and of the accompanying noises.

In the unit 3 for measuring the peak value of an impact impulse the high order decade 64 is filled from the count pulse shaper 61 via the OR gate 63. The signal is supplied from the input of the high order decade 64 to the input of the counting decade 5 (FIG. 1) of the noise rejector 4. The signals from the outputs of the high and low order decades 64 and 62 (FIG. 4) of the unit 3 for measuring the peak value of an impact impulse are fed to respective inputs of the memory registers 6 and 7 of the noise rejector 4.

The unit 3 for measuring the peak value of an impact pulse is a servo-balancing analogue-to-digital convertor. The unit 3 operates as follows The signal generated from the amplification unit 2 is fed to the input of the coarse comparator 59 and of the fine comparator 60. The other input of the coarse comparator 59 and of the fine comparator 60 has applied to it the voltage output of the decoder 65, the decoder 65 being an analogue-to-digital convertor controlled by two binary decade counters, a high order decade 64 and a low order decade 62.

Before taking any measurements the decades 64 and 62 are set so that a zero potential appears at the output of the decoder 65.

After a positive potential is applied to the input of the unit 3 for measuring the peak value of an impact pulse, the comparators 59 and 60 operate to allow the passage of counting pulses via the count pulse shaper 61 and the OR gate 63 to the inputs of the low and of the high order decade counters 62 and 64. The output voltage of the decoder 65 will rise in steps. As soon as this voltage approximates the input, the fine comparator 60 operates and the counting pulses are fed only to the input of the low order decade counter 62; the counting pulses applied to the input of the high order decade counter 64 are derived only from the output of the low order decade counter 62 via the OR gate 63. As soon as the voltage of the decoder 65 becomes equal to the input of the unit 3 for measuring the peak value of an impact pulse, one supply of counting pulses to the inputs of the decades 62 and 64 ceases.

Thus, the high and low order decades 64 and 62 accumulate information on the peak value of the signal being measured. New measurements may be obtained by resetting the decades 62 and 64.

The outputs of the decades 62 and 64 are the non-inverted outputs of the flip-flop incorporated in the decades 62 and 64. These outputs are then connected to the memory registers 6 and 7. The output connected to the counting decade 5 is used to pick up information on the number of pulses in the high order decade 64 to effect operation of the noise rejector 4.

The sequence of pulses 66 (FIG. 5) carrying information on the peak value of an impact impulse and on the noise level is supplied to the input of the counting decade 5 (FIG. 1) of the noise rejector 4 from the input of the high order decade 64 (FIG. 4) of the unit 3 for measuring the peak value of an impact impulse.

This information is transcribed from the counting decade 5 (FIG. 1) into the memory registers 6 and 7 and is fed to the indicator 8.

To avoid indication of noise pulses in the impact impulse measuring device, permission for transcription is given only when the number of pulses fed to the input of the counting decade 5 exceeds a predetermined number set in relation to the high order decade 64 (FIG. 4) of the unit 3 for measuring the peak value of an impact impulse.

During measurement of the parameters of the impact impulses, the signal fed to the input may feature voltage overshoots corresponding to different impact loads applied to the object being tested, but it is only necessary to measure the peak value of the voltage corresponding to the main impact impulse. The invention compares the peak value of the voltage being measured with a preset discrete level of 0, 10, 20, 30, 40, 50, 60 or 70% of the maximum possible value of the measured voltage, and indicates only the voltage overshoots which exceed this level. The voltage overshoots whose peak value is lower than the preset level is referred to as noise. Thus, the main impact impulse is discriminated and its parameters are displayed.

The noise rejector 4 (FIG. 1) ensures eight values of noise level designated as O, I, II, III, IV, V, VI, VII. These values of noise levels are set by means of the contacts 24, 25, and 26 (FIG. 2) of the commutator 12.

Figure 2:
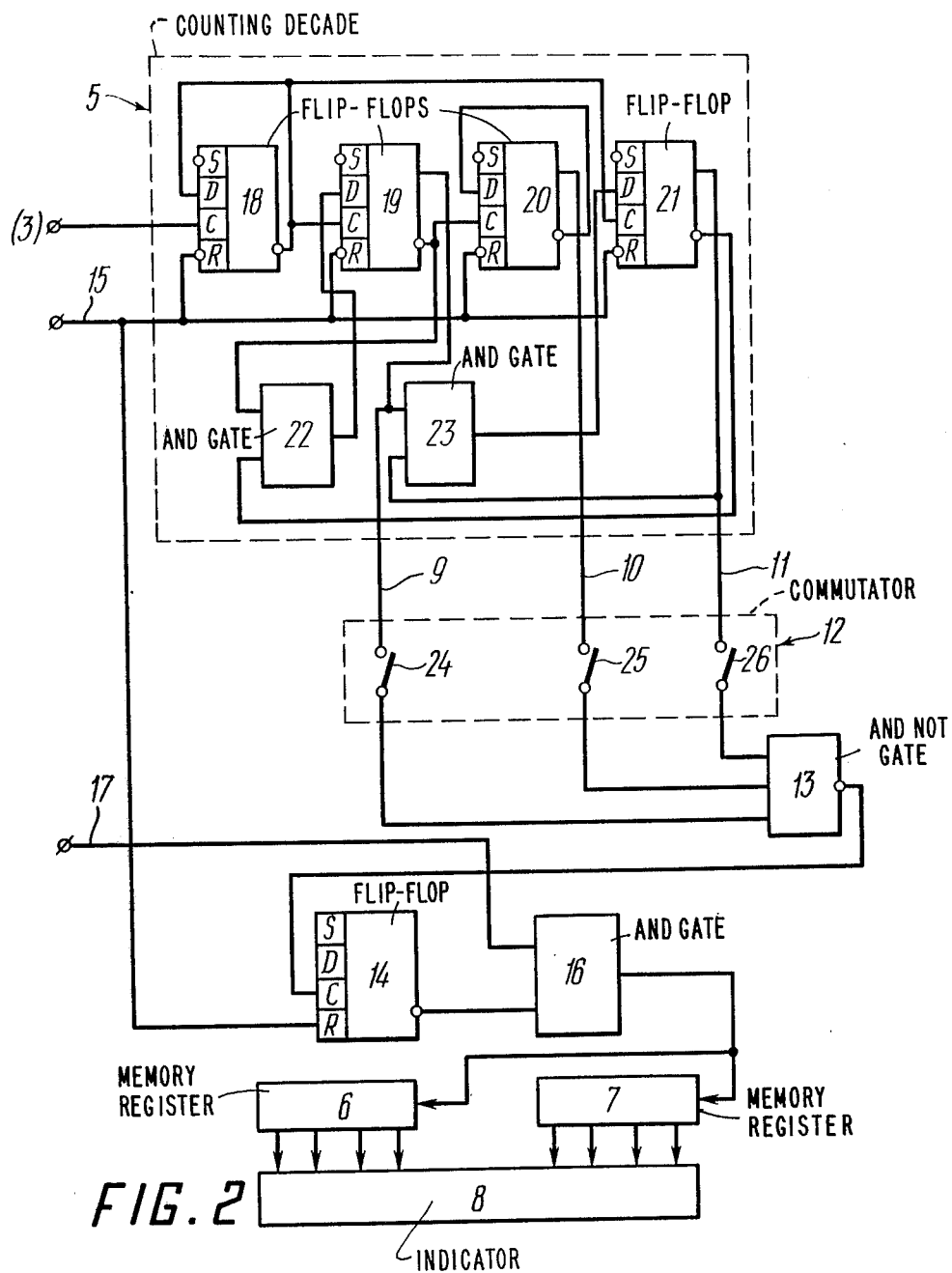
FIG. 2 is a functional diagram of a noise rejector, according to the invention.

The outputs of the counting decade 5 are inverted outputs of the D-flip-flops 18, 19, 20 and 21 the counting decade 5 uses. Depending on which of the contacts 24, 25 or 26 of the commutator 12 are closed, will depend from which of the three outputs of the counting decade 5 the signals 67, 68 or 69 (FIG. 5) are fed to the AND NOT gate 13 (FIG. 2). The values of the protection levels depending on the state of the contacts 24, 25 and 26 of the commutator 12 are given in the Table 1.

Table 1

| Protection level value | State of contacts 24, 25, 26 of commutator 12 B - disconnected; C - connected | | |
|---|---|---|---|
| | contact 24 | contact 25 | contact 26 |
| 0 | B | B | B |
| I | C | B | B |
| II | B | C | B |
| III | C | C | B |
| IV | B | B | C |
| V | C | B | C |
| VI | B | C | B |
| VII | C | C | C |

The pulses 70, 71, 72, 73, 74, 75 and 76 (FIG. 5) are produced at the output of the AND NOT gate 13 depending on the state of the contacts 24, 25, 26. FIG. 5 indicates the pulse at the output of the AND NOT gate 13 is generated only after passing of the input pulse from the pulse train 66, which corresponds to the specified value of the protection level. The signal from the output of the AND NOT gate 13 is supplied to the adjustment C-input of the flip-flop 14 (FIG. 2) and the positive pulse 79 is produced at the output of the flip-flop 14. In FIG. 5 this pulse corresponds to the protection level equal to three and designated in the table I as III. Pulses 72 (FIG. 5) are in this case generated at the ouput of the AND NOT gate 13 (FIG. 2).

The pulse 79 from the output of the flip-flop 14 (FIG. 2) is fed to one of the inputs of the AND gate 16 and permits the advance of the transcription pulse 77 (FIG. 5) from the transcription line 17 (FIG. 2) to the output of the AND gate 16, and the pulse 80 (FIG. 5) is fed from the output of the AND gate 16 (FIG. 2) to the memory registers 6 and 7. All noise pulses which have values below the specified protection level, which in this case is equal to three, and not consequently supplied to the memory registers 6 and 7. The signals from the outputs of the D-flip-flops of the memory registers 6 and 7 (FIG. 3) are fed to the high order 27 and low order 28 of the indicator 8. The operation of the high order 27 and the low order 28 has been described in several books (cf. for example, L. M. Goldenberg, Pulse and Digit Devices, Svyaz Publishers, Moscow, 1973, p. 462). Control voltages are supplied from collectors of the transistors 47, 48, 49, 51, 52, 53 and 54 of the high order 27 to the anodes of the indicator tube 56. The transistor 50 and the resistor 55 serve to invert the signal from the output of the logical element 42. A decimal digit is lighted in the segments of the indicator lamp 56, which corresponds to the information recorded in the memory register 6 of the high order 27 of the indicator 8. The low order 28 of the indicator 8 operates similarly. The value of the peak impact impulse is lighted in the lamps of the indicator 8. After measuring the peak value to reset pulse 78 (FIG. 5) is supplied to the R-input of the flip-flop 14 (FIG. 2) and to the R-inputs of the flip-flops 18, 19, 20 and 21 by means of the reset line 15. This pulse 78 brings the flip-flops 14, 18, 19, 20 and 21 (FIG. 2) into the initial state.

The invention operates as follows.

Applied to the input of the unit 3 for measuring the peak value of an impact impulse is a signal with both a voltage pulse, which corresponds to the main impact impluse, and noise voltage overshoots. Each voltage overshoot is measured. The high and low order decade counters 64 and 62 of the unit 3 for measuring the peak value of an impact impulse store a definite number of impulses proportional to the voltage overshoot peak value at the output of the unit 3 for measuring the peak value of an impact impulse.

Each counting decade 62 and 64 has four flip-flops whose non-inverted ouputs are in the 0 or 1 state depending on the digit recorded. If the high order decade 64 flip-flop outputs are connected with the inputs of the commutator 12, it will put out pulses only after the number of pulses fed to the input of the high order decade 64 exceeds the preset level. The commutator 12 output pulses reverse the control flip-flop 14. The flip-flop 14 output potential will now allow transcription to the memory registers 6 and 7 after passage of the main impact impulse.

The impact impulse peak value information is supplied to the memory registers 6 and 7 in a parallel code during passage of the transcription code 77. Thus, the indicator 8 coupled with the memory registers 6 and 7 will display the signals whose peak value exceeds the noise level set on the commutator 12. The simplest way is to provide a commutator 12 with numbers 0, 1, 2, 3, 4, 5, 6 and 7 for use with the four digit binary representation code. In order to prevent overloading of the high decade 64 flip-flops of the unit 3 for measuring the peak value of an impact impulse, an additional counting decade 5 operating with the same code is used, the input of said counting decade 5 receiving counting impulses from the input of the high order decade 64.

The proposed impact impulse measuring device considerably decreases the error in measuring the peak value of an impact impulse by rejecting the noise pulses and increases the quality of results obtained in shock tests, thus resulting in cutting expenditures for such tests.

What we claim is:

1. An impact impulse measuring device comprising:
   a. an acceleration pick-up for transforming a mechanical shock into electrical signals having an output;
   b. an amplification unit having an input and an output, said input of said amplification unit being connected to said output of said acceleration pick-up;
   c. a unit for measuring the peak value of an impact impulse having an input and outputs, said input of said unit for measuring the peak value of an impact impulse being connected to the output of the amplification unit;
   d. a noise rejector electrically connected to said unit for measuring the peak value of an impact impulse and having information inputs and an adjustment input;
   e. a counting decade of said noise rejector having an input and outputs, said input of said counting decade is said adjustment input of said noise rejector and is connected to one of said outputs of said unit for measuring the peak value of an impact impulse;
   f. a commutator of said noise rejector having inputs and outputs, said inputs of said commutator are connected to said outputs of said counting decade;
   g. an AND NOT gate of said noise rejector having inputs and outputs, said inputs of said AND NOT gate are connected to said outputs of said commutator;
   h. a flip-flop of said noise rejector having an adjustment input and an output, said adjustment input of said flip-flop being connected to said output of said AND NOT gate;
   i. an AND gate of said noise rejector having inputs and an output, one of said inputs of said AND gate being connected to said output of said flip-flop;
   j. a transcription line of said noise rejector, another of said inputs of said AND gate being connected to said transcription line;
   k. memory registers of said noise rejector having information inputs, an adjustment input and outputs, said adjustment input of said memory registers being connected to said output of said AND element, said information inputs of said memory registers being connected to said outputs of the unit for measuring the peak value of an input impulse which are not connected to said counting decade; and
   l. an indicator connected to said outputs of said memory registers.

2. The impact impulse measuring device according to claim 1, wherein said unit for measuring the peak value of an impact impulse includes a fine comparator having an input connected to said output of said amplification unit; a coarse comparator having an input connected to said output of said amplification unit; said input of said fine comparator and of said coarse comparator is said input of said unit for measuring the peak value of an impact impulse; a count pulse having inputs connected to an output of said fine comparator and of said coarse comparator; a low order decade counter having its input connected to an output of said count pulse shaper; a high order decade counter having its input connected to an OR gate, said OR gate having its inputs connected to an output of said low order decade counter and to another output of said count pulse shaper, said input of said high order decade counter is said output of said unit for measuring the peak value of an impact impulse which is connected to said input of said counting decade of said noise rejector; outputs of said high order decade counter and of said low order decade counter are said outputs of said unit for measuring the peak value of an impact impulse which are connected to said information inputs of said memory registers of said noise rejector; a decoder having its inputs connected to another output of said high order decade counter and of said low order decade counter and having its output connected to another input of said fine comparator and of said coarse comparator.

3. The impact impulse measuring device according to claim 1, wherein said counting decade of said noise rejector includes a plurality of flip-flops and a plurality of AND gates.

4. The impact impulse measuring device according to claim 1, wherein said memory registers of said noise rejector include flip-flops.

5. The impact impulse measuring device according to claim 4, wherein said indicator includes a high or a low order for each of said memory registers, each of said high or low orders having a plurality of AND NOT gates, a plurality of transistors, a resistor and an indicator lamp with load resistors.

* * * * *